United States Patent [19]

Schade, Jr.

[11] 4,243,948
[45] Jan. 6, 1981

[54] SUBSTANTIALLY TEMPERATURE-INDEPENDENT TRIMMING OF CURRENT FLOWS

[75] Inventor: Otto H. Schade, Jr., North Caldwell, N.J.

[73] Assignee: RCA Corporation, New York, N.Y.

[21] Appl. No.: 37,139

[22] Filed: May 8, 1979

[51] Int. Cl.³ .............................................. H03F 3/04
[52] U.S. Cl. .................................. 330/289; 307/229; 307/296 R; 307/310; 330/288
[58] Field of Search .............................. 330/289, 288; 307/296 R, 310

[56] References Cited
U.S. PATENT DOCUMENTS

| | | | |
|---|---|---|---|
| 3,050,644 | 8/1962 | Ironside | 330/289 |
| 3,268,739 | 8/1966 | Dickson | 307/310 |
| 3,430,076 | 2/1969 | Overtveld | 307/310 |
| 3,531,655 | 9/1970 | Taylor | 307/310 |
| 4,055,811 | 10/1977 | Wheatley | 330/289 |

*Primary Examiner*—Harold A. Dixon
*Attorney, Agent, or Firm*—E. M. Whitacre; Paul J. Rasmussen; Allen LeRoy Limberg

[57] ABSTRACT

A current I of predetermined temperature coefficient is supplied to the series connection of at least one semiconductor diode and a positive-temperature-coefficient resistance. This resistance is of such value that a voltage drop with a temperature-coefficient equal to that of I, in terms of percentage change per degree of temperature change, appears across the series connection. A relatively large, zero-temperature-coefficient, adjustable resistance, alone or in series with a zero-temperature-coefficient voltage source, parallels the series connection. Adjustment of the relatively large zero-temperature-coefficient resistance provides a trim for the current flow in the series connection, which trim is substantially unaffected by changing temperature.

44 Claims, 15 Drawing Figures

SUBSTANTIALLY TEMPERATURE-INDEPENDENT TRIMMING OF CURRENT FLOWS

The present invention relates to substantially temperature-independent trimming of current flows.

In the prior-art monolithically integrated current amplifiers commonly employ first and second transistors with their emitter electrodes connected to a common point by respective emitter degeneration resistances and having essentially equal quiescent potentials applied to their base electrodes to forward-bias their base-emitter junctions. It has been common practice in the prior art to adjust the relative transconductance of these transistors by a potentiometer connected at its two ends to the two transistor emitter electrodes, respectively, and at its adjustable tap-point terminal to the common point. The potentiometer provides push-pull trim of the two emitter degeneration resistances for adjusting the relative amounts by which the transistors are degenerated by current feedback, thereby adjusting the relative transconductances of the transistors.

The shortcoming of this practice is that the temperature of the potentiometer is not easily constrained to change in the same manner as the temperature of the emitter degeneration resistors, nor does the resistance of the potentiometer exhibit a temperature coefficient similar to that of the emitter degeneration resistances. As a result, the current gain adjustment with this prior art method tends to be undesirably temperature-sensitive. Precisely correct current gain is achieved only at a specific transistor operating temperature. Generally speaking, the elements within the integrated circuit operate at temperatures which closely track a temperature T appearing at some point in the integrated circuit, and this can be helpful in providing for temperature-independent trimming of the current gain of current mirror amplifiers.

C. F. Wheatley, Jr. in U.S. Pat. Nos. 4,051,441 and 4,055,811 respectively issued Sept. 27 and Oct. 25, 1977, and each entitled "TRANSISTOR AMPLIFIERS" describes solutions to the problem of temperature-independent trimming of the current gain of current mirror amplifiers. The present invention is directed to another type of solution to this problem, building from A. L. R. Limberg's teaching in U.S. Pat. No. 3,534,245 issued Oct. 13, 1970 and entitled "ELECTRICAL CIRCUIT FOR PROVIDING SUBSTANTIALLY CONSTANT CURRENT". Limberg taught that a particular value of voltage with zero or small coefficient of change with temperature would, when applied to the series connection of a semiconductor diode and a resistance with prescribed positive temperature coefficient, result in constant, temperature-independent current flow through the series connection. The present inventor has perceived that there is a converse to the Limberg teaching which can be proven in accordance with Ohm's Law considerations. Namely, application of constant, temperature-independent current to the series connection of a semiconductor diode and a positive-temperature coefficient resistance of correct value will result in a constant, temperature-independent voltage being developed across the series connection. Furthermore, the present inventor has discerned that a current that has reasonably weak linear dependence upon a temperature T liable to variation, when applied to the series connection of a semiconductor diode and a positive-temperature-coefficient resistance dependent upon a temperature T, will result in a voltage drop of desired temperature coefficient characteristics being developed across the series connection, if the resistance be of correct value.

The present invention is embodied in electronic apparatus wherein the series connection of positive-temperature-coefficient resistance and semiconductor diode is paralleled with a circuit for generating trim current. This circuit either consists of a relatively large, zero-temperature-coefficient, adjustable resistance or comprises such a resistance in series connection with a zero-temperature-coefficient voltage source.

In the drawing.

Each of

Figure 1:
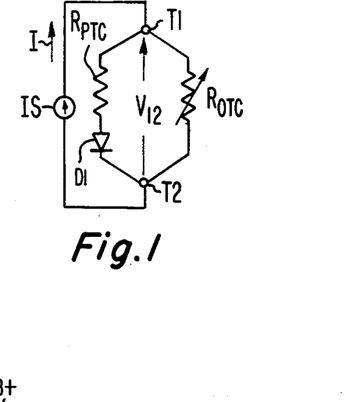
FIGS. 1 and 2 is a schematic drawing of basic elements used for trimming current in embodiments of the present invention.

In FIG. 1 a current source, or constant current generator, IS causes a current flow from a first terminal T1 to a second terminal T2, between which terminals there is a series connection of a resistive element $R_{PTC}$ and a semiconductor junction diode D1. This series connection is paralleled by a relatively high resistance rheostat $R_{OTC}$ having a resistance typically tens of times that of $R_{PTC}$. D1 is typically constructed from an NPN transistor, the emitter of which functions as the cathode of the diode, and the interconnection of the collector and base electrodes of which functions as the anode of the diode. Similar structures excepting for use of a PNP transistor and simpler structures using only a P-N junction are also possible. In any case D1 is poled for forward conduction of the major portion of the current I that flows through its series connection with $R_{PTC}$.

$R_{PTC}$ is operated at substantially the same temperature T as D1 and has a resistance with positive temperature coefficient; this is readily achieved using a diffused silicon resistor in an integrated circuit structure that includes D1 as well. The current I is a zero-temperature-coefficient current that does not change in temperature, or is a current with a relatively low temperature coefficient compared to the negative temperature coefficient exhibited by the offset potential across D1 or the positive temperature coefficient of resistance exhibited by resistive element $R_{PTC}$. If I exhibits change with change in a temperature, this temperature is also substantially equal to T. Under these conditions there exist values of resistance for $R_{PTC}$ which will result in the potential $V_{12}$ between terminals T1 and T2 having a value exhibiting the same temperature coefficient (in terms of percentage change per degree of temperature change) as the current I, having a value that is temperature-independent, or has a value anywhere in a range including these two values of voltage. The rheostat $R_{OTC}$ has a resistance with zero-temperature-coefficient for directing unto itself a relatively small portion—e.g.

a few percent—of the current I, which portion will have the same well-defined temperature coefficient as $V_{12}$ even though $R_{OTC}$ is located external to the integrated circuit.

For example, consider $R_{PTC}$ and D1 constructed using the monolithic integrated circuit process presently employed by RCA Corporation, with I being presumed to have a temperature-independent value of 110 microamperes. The setting of rheostat $R_{OTC}$ is presumed to divert 10 microamperes to itself, so 100 microamperes flows through the series connection of $R_{PTC}$ and diode D1. Assuming D1 to be a diode-connected NPN transistor as described above, which diode-connected transistor is the normal small-current transistor (with one square mil emitter region) as used on the CA3046 five-transistor array, the offset potential across D1 has a value of 675 millivolts—1.9 millivolts per Kelvin at 300 K reference temperature. $R_{PTC}$ is assumed to be a single-diffused 200 ohms-per-square p-material resistor formed concurrently with the base diffusion of the NPN transistor and, as such, has a nominal positive temperature coefficient of 1.7 parts per thousand per Kelvin. In order for the voltage drop across $R_{PTC}$ to have a 1.9 millivolt per Kelvin increase, the voltage drop at reference temperature must be 1.9 millivolts per Kelvin divided by 1.7 parts per thousand per Kelvin—that is 1.118 volts. This voltage plus the offset potential across D1 sum to a temperature-independent voltage $V_{12}$ of 1.793 volts—i.e. approximately 1.8 volts. Ohm's Law requires $R_{PTC}$ to have a resistance equal at reference temperature to the 1.118 volts nominal drop thereacross divided by 100 microamperes—i.e. to 11,180 ohms. Ohm's Law requires $R_{OTC}$ to have a nominal resistance equal to the 1.8 volts nominal drop thereacross divided by 10 microamperes nominal current therethrough—i.e., to 180 kilohms.

Figure 2:
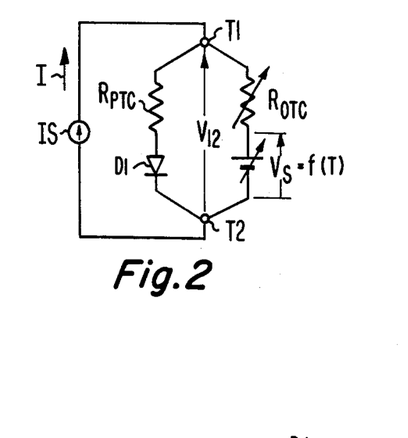

The introduction of a voltage source VS in series with $R_{OTC}$ between terminals T1 and T2, as shown in FIG. 2, will also provide for temperature-independent trimming of the current through the series connection of $R_{PTC}$ and $D_1$, so long as the voltage $V_S$ the source VS supplies is temperature-independent and differs from $V_{12}$. In such instance the resistance of $R_{OTC}$, or the voltage $V_S$, or both may be varied to trim the current through the series connection of $R_{PTC}$ and $D_1$. If $V_S$ is larger than $V_{12}$, the adjustable trim current will augment the flow of current through the series connection of $R_{PTC}$ and $D_1$. If $V_S$ is smaller than $V_{12}$, the adjustable trim current will decrement the flow of current through the series connection of $R_{PTC}$ and D1.

Figure 3:
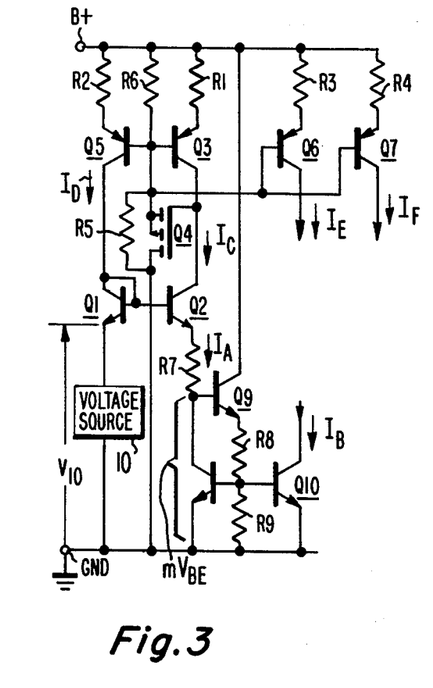
FIG. 3 is a schematic diagram of circuitry for developing zero-temperature-coefficient currents used in connection with the present invention.

FIG. 3 shows representative monolithic integrated circuitry for generating zero-temperature-coefficient currents that can be used together with the embodiments of the invention to be described. Positive operating voltage is applied between the GND and B+ terminals. A zero-temperature-coefficient voltage source 10 is provided—e.g. by a compensated avalanche diode or by a voltage regulator regulating its output voltage to a multiple of the extrapolated band gap voltage of a semiconductor material—for applying a zero-temperature-coefficient voltage $V_{10}$ to the emitter of PNP transistor Q1. Q1 is provided with direct-coupled collector-to-base feedback conditioning it to operate as an offset diode, augmenting $V_{10}$ by its emitter-to-base offset potential $V_{BEQ1}$, for applying a base voltage $(V_{10}+V_{BEQ1})$ to another NPN transistor Q2. $V_{BEQ1}$ compensates for the emitter-to-base potential $V_{BEQ2}$ of Q2 owing to emitter follower action in Q2, so the emitter potential $V_{EQ2}$ of Q2 is equal to the zero-temperature-coefficient potential $V_{10}$. The value of the emitter current $I_A$ of Q2 owing to $V_{EQ2}$ being applied to its emitter resistance is determined in a manner to be subsequently described and gives rise to a collector current $I_C$ for Q2 that substantially equals $I_A$. $I_C$ is applied as input current to a plural output current mirror amplifier configuration comprising transistors Q3, Q4, Q5, Q6 and resistors R1, R2, R3, R4, R5, R6 to generate proportionally related output currents $I_D$, $I_E$ and $I_F$. $I_D$ is used as the forward bias current for diode-operated transistor Q1.

More particularly, PNP transistor Q3 functions as the master mirror transistor, being provided direct-coupled collector-to-base feedback by the source-follower action of p-channel field effect transistor Q4 for adjusting its base potential $V_{BQ4}$ to condition it to supply a collector current equal to the collector current $I_C$ demanded by Q2. $V_{BQ4}$ is applied to the base electrodes of slave mirroring transistors Q5, Q6, Q7 to condition them to supply respective collector currents $I_D$, $I_E$, $I_F$ proportional to $I_C$. Were resistors R1, R2, R3, R4 zero-valued, the proportions of these currents would be determined solely by the relative collector current versus emitter-to-base voltage characteristics of Q3, Q5, Q6 and Q7. It is conventional practice to increase the reliability of this current-tracking by including resistors R1, R2, R3, R4 having conductances in similar ratio as the collector currents of the transistors, the emitters of which they respectively degenerate, when these transistors are biased with similar emitter-to-base voltages. The resistive potential divider formed by resistors R5 and R6 is used to assure conduction of transistors Q3 and Q5 when the positive operating potential B+ is initially applied.

Limberg, in U.S. Pat. No. 3,534,245, teaches how to obtain zero-temperature-coefficient current flows $I_A$ and $I_B$. The value of voltage which, when applied to the series connection of a semiconductor diode D1 and positive-temperature-coefficient resistor $R_{PTC}$, would result in a zero-temperature-coefficient current $I_A$ is divided into $V_{10}$ to obtain a factor m. E.g., supposing $V_{10}$ to have a value of 6.2 volts as provided by a temperature-compensated avalanche diode, its division by the temperature-independent $V_{12}$ of 1.8 volt (determined for the 100 microampere level by previous calculations) would result in an m factor of 3.46. $V_{EQ2}$ is applied to the series connection of a positive-temperature-coefficient resistor R7 and a circuit providing a negative-temperature-coefficient offset potential that is 3.46 times that of a simple semiconductor function carrying the 100 microampere level. R7 is chosen to have a resistance $R_7$ at reference temperature 3.46 times that of $R_{PTC}$—i.e., a resistance of 3868 ohms—to set up the 100 microamperes of current flow in accordance with Ohm's Law.

NPN transistor Q8 is provided with direct-coupled collector-to-base feedback of a nature to regulate its emitter-to-collector voltage $V_{CEQ8}$ to be 3.46 times its emitter-to-base offset potential $V_{BEQ8}$, while adjusting $V_{BEQ8}$ to condition Q8 for conducting substantially all of $I_A$ as collector current. In determining this 3.46 times $V_{BEQ8}$ potential, an offset potential $V_{BEQ9}$ owing to the emitter-follower action of NPN transistor Q9 reduces the potential that must be maintained between the emitters of Q8 and Q9 by an amount essentially equal to $V_{BEQ8}$. A resistive potential divider comprising serially connected resistors R8 and R9 divides this potential for application as $V_{BEQ8}$ between the emitter and base electrodes of Q8. By choosing the resistance of resistor R9 small enough, compared to the base input impedances of NPN transistors Q8 and Q10, that substantially all the current through resistor R8 flows through R9, then by Ohm's Law the potential drop across R8 and R9 will be related in the same proportion as their respective resistances $R_8$ and $R_9$. By making $R_8$ to be m−2 times—i.e., 1.46 times—as large as $R_9$, the emitter potential of Q9 will be regulated to be 2.46 $V_{BEQ8}$; and $V_{CEQ8}$ will be regulated to be 3.46 $V_{BEQ8}$, as desired. The respective collector currents $I_A$ and $I_B$ of Q8 and Q10 will be proportionally related as their respective collector current versus emitter-to-base voltage characteristics, owing to their respective emitter-to-base voltages $V_{BEQ8}$ and $V_{BEQ10}$ being identical.

Choosing the factor m to be larger than for the zero-temperature-coefficient $I_1$ condition will result in the drop across R7 having a stronger positive temperature coefficient than $R_7$, so $I_A$ will have a positive temperature coefficient, as will $I_C$ and proportionally related currents $I_B$, $I_D$, $I_E$, $I_F$. Choosing the factor m to be smaller than for the zero-temperature-coefficient $I_A$ condition will result in the drop across R7 having a weaker positive temperature coefficient than $R_7$—or even a zero—or negative-temperature coefficient—so $I_A$ will have a negative temperature coefficient, as will $I_C$ and the proportionally related currents $I_B$, $I_D$, $I_E$, $I_F$. For any one of these three possible cases, however, suppose a current proportionally related to $I_A$—say p times $I_A$, p being an arbitrary constant—is applied to a series connection that includes together with a diode a resistance equal to $R_7/mp$. It can be shown by using proportionality between currents and by using Ohm's Law that the potential drop across the series connection will be $V_{10}/m$.

Where there is no need for current $I_F$, elements Q7 and R4 will be omitted from the FIG. 3 circuit; conversely, further slave transistors may be included in the current mirror structure including transistors Q3, Q4, A5, Q6, Q7. The structure comprising resistors R8, R9 and transistors Q8, Q9, Q10 may also be regarded as a current mirror amplifier configuration with Q8 as master mirroring transistor and Q10 as slave. Q10 will be omitted if $I_B$ is not needed; conversely, further slave transistors besides Q10 can be added.

Figure 4:
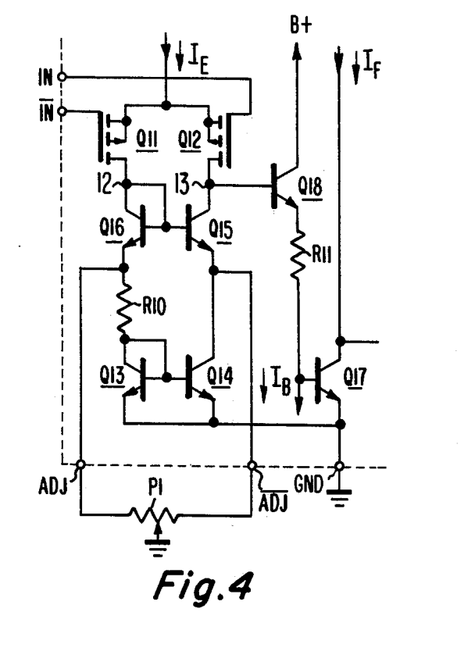
FIGS. 4, 5, 6, 7, 8, 9, 10, 11 and 12 are schematic diagrams, each showing a differential amplifier followed by a balanced-to-single-ended signal converter, the currents applied to the converter being provided temperature-tracking trim in a respective embodiment of the present invention.

FIG. 4 shows a differential-input, single-ended-output amplifier stage (as may be used for the input stage of an operational amplifier, for instance), the output balance of which is adjusted in accordance with the invention. Those elements to the upper right of the dashed boundary line 11 are presumed to be constructed within the confines of a monolithic integrated circuit provided with terminals IN, $\overline{\text{IN}}$, ADJ, $\overline{\text{ADJ}}$ and GND among others. The GND terminal is shown as being grounded. P-channel field effect transistors (FET's) Q11 and Q12 are in long-tailed-pair configuration receiving $I_E$ at their joined source electrodes and having their respective base electrodes at the inverting input signal terminal IN and non-inverting input signal terminal $\overline{\text{IN}}$, respectively. Q11 and Q12 are shown as FET's to eliminate concern with base currents, but PNP bipolar transistors can be used instead, accommodation to the use of such transistors being easily made by one skilled in the art of transistor electronics design. Q11 and Q12 are presumed nominally to have tracking drain current versus source-to-gate potential characteristics, so $I_E$ is apportioned in constant ratio between their principal current conduction—i.e., source-to-drain—paths. Normally half of $I_E$ flows through each path for the quiescent condition, in which equal voltages are applied to terminals IN and $\overline{\text{IN}}$.

Resistor R10 and NPN transistors Q13, Q14, Q15, Q16 are connected in current mirror amplifier (CMA) configuration. This configuration has its input connection at node 12 from the drain of Q11, has its output connection to node 13 (to which the drain of Q12 also connects), and has its common connection to terminal GND. This CMA configuration is used as a balanced-to-single-ended signal converter for differentially combining the drain currents $I_{DQ11}$ and $I_{DQ12}$ of Q11 and Q12 to provide output current (or charge) from node 13, to a succeeding common-emitter amplifier stage. The core of this CMA configuration comprises master mirror transistor Q13 and slave mirroring transistor Q14. Q13 has a direct collector-to-base feedback connection adjusting its emitter-to-base potential $V_{BEQ13}$ for conditioning it to conduct as collector current substantially all of $I_{DQ11}$ as conducted by diode-connected NPN transistor Q16 and R10. Slave mirroring transistor Q14 has applied to it an emitter-to-base potential $V_{BEQ14}$ equal to $V_{BEQ13}$. Q14 is the common-emitter amplifier component of a cascode amplifier, of which Q15 is the common-base amplifier component. The potential drop appearing across the series connection of diode-connected Q16 and R10 owing to the passage of $I_{DQ11}$, offsets the base potentials of Q14 and Q15 to bias them for cascode operation.

Resistor R10 conducts substantially all the drain current $I_{DQ11}$ of Q11, which is a p times $I_A$ current. R10 has a positive-temperature-coefficient resistance $R_{10} = R_7/mp$. Substantially all the current through R10 subsequently is conducted by NPN transistor Q13 operated as a semiconductor diode with connected collector and base electrodes. $I_{DQ11}$ will then develop a potential equal to $V_{10}/M$ between the terminals GND and ADJ at the ends of the series connection of R10 and diode-connected and -operated Q13, permitting trimming of the current in this series connection as taught in the description of FIG. 1 or 2.

But further, the zero-offset potential-follower action afforded by Q16 and Q15 operating in concert places terminal $\overline{\text{ADJ}}$ at the emitter of Q15 at a potential essentially equal to $V_{10}/m$. (The potential at the joined bases of Q15 and Q16 is more positive than that at terminal ADJ by the emitter-to-base offset potential $V_{BEQ16}$ of Q16; the potential at terminal $\overline{\text{ADJ}}$ is less positive than that at the joined base electrodes of Q15 and Q16 by the emitter-to-base offset potential $V_{BEQ16}$ of Q16; and $V_{BEQ15}$ and $V_{BEQ16}$ have essentially equal quiescent values.) So a potentiometer P1 with zero-temperature-coefficient resistance between end terminals respectively connected at separate ones of the ADJ and $\overline{\text{ADJ}}$ terminals and with an adjustable-tap terminal connected to a point of potential fixed respective to ground potential—or indeed, as shown, to ground potential itself—affords a simple symmetrical form of adjustment of the balanced-to-single-ended signal converter provided by the CMA built around Q13 and Q14. The adjustable-tap terminal connection may include a zero-temperature-coefficient "stop" resistance (not shown) to preclude disabling of the amplifier stage due to potentiometer adjustment and to provide more of a vernier action in the adjustment.

If is often desirable to direct-couple node 13 to the base of an ensuing NPN grounded-emitter-amplifier transistor Q17. Preferably, this is done so that the quiescent potential $V_{13}$ at node 13 equals the quiescent potential $V_{12}$ at node 12 so that Q11 and Q12 are presented equal respective source-to-drain potentials $V_{DSQ11}$ and $V_{DSQ12}$. As taught by O. H. Schade, Jr., in U.S. Pat. No. 3,852,679 issued Dec. 3, 1974 and entitled "CURRENT MIRROR AMPLIFIERS" this results in lower input offset potential error between terminals IN and $\overline{IN}$, owing to better matching of the operating characteristics of Q11 and Q12. Such direct-coupling is simply done using an NPN common-collector-amplifier transistor Q18 with base connected at node 13 and with emitter connected via a resistor R11 to the base of Q17. The emitter-follower action of Q18 provides an emitter-to-base offset potential $V_{BEQ18}$ that essentially compensates for the offset potential of Q16; the emitter-to-base offset potential $V_{BEQ17}$ of Q17 essentially compensates for the offset potential of Q13; and the quiescent potential drop across R10 is compensated for by a potential drop across R11, generated by flowing a current $I_B$ therethrough. $I_B$ like $I_E$ is proportionally related to $I_A$, and the conductance of R10 is proportionally related to that of R11 in the same ratio as $I_E/2$ is proportionally related to $I_B$. Preferably, this ratio is chosen so the base current of Q18 will essentially compensate for expected base current errors in the balanced-to-single-ended signal converter; and the areas of the emitter-base junctions of Q15, Q16, and Q18 will be chosen by the careful designer to make the quiescent offset potentials across these junctions still closer in value. Q17 is shown as being operated with constant current generator loading—i.e., $I_F$—and will provide at node 14 amplified current responsive to the voltage difference between the terminals IN and $\overline{IN}$.

Figure 5:
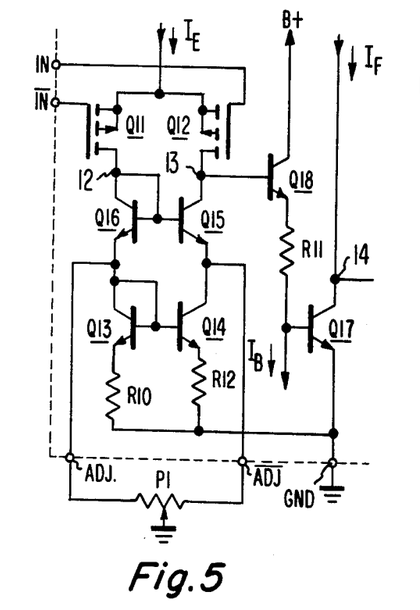

FIG. 5 shows a modified form of the FIG. 4 circuitry in which the connections of Q14 are modified. Its base receives a potential equal to the offset potential across diode-connected transistor Q13 plus the potential drop across R10; and its emitter is connected to ground via an emitted degeneration resistor R12. R12 has a resistance chosen such that under quiescent conditions the drain current $I_{DQ12}$ of Q12 is conducted substantially in full by the cascode connection of Q14 and Q15. (The respective positions of R10 and diode-connected Q13, incidentally, are reversed in FIG. 5 from the order shown in FIG. 4, although either order works as well in FIG. 5.) The degeneration of the mirror elements Q13 and Q14 advantageously makes the accuracy of current gain less dependent upon the matching of the collector current versus emitter-to-base voltage characteristics of these transistors.

Figure 6:
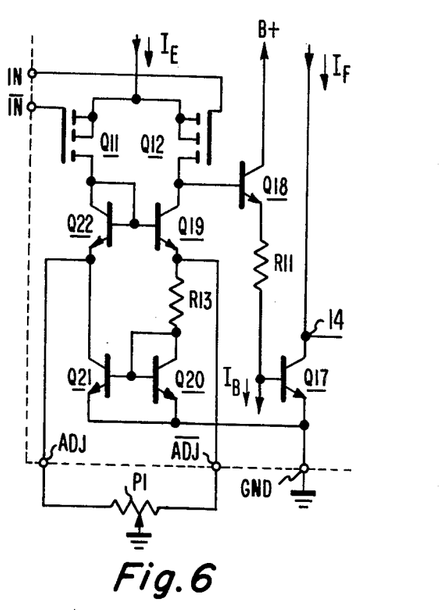

In FIG. 6 NPN transistor Q19 is provided with emitter-to-base degenerative current feedback via resistor R13, a simple current mirror amplifier connection of NPN master mirroring transistor Q20 and NPN slave mirroring transistor Q21, and diode-connected transistor Q22. This current feedback constrains the emitter current $I_{EQ19}$ of Q19 to be related to $I_{DQ11}$ by the gain of the CMA connection of Q20 and Q21. Thus, since the quiescent value of $I_{DQ11}$ is proportional to $I_A$, $I_{EQ19}$ is also and is of the p times $I_A$ form. So by making the resistance $R_{13}$ of R13 equal to $R_7/mp$ the quiescent voltage applied to the $\overline{ADJ}$ terminal from the emitter of Q19 substantially equals $V_{10}/m$. A similar quiescent voltage appears at the ADJ terminal at the emitter of diode-connected Q22, less positive than the voltage at the joined base electrodes of Q19 and Q22 by the emitter-to-base offset potential $V_{Q22}$ of Q22, which joined base electrodes are in turn more positive than the voltage at the ADJ terminal of the emitter-to-base offset potential $V_{BEQ19}$ of Q19. The terminals ADJ and $\overline{ADJ}$ are thus suited for connection to a trimming potentiometer P1 in a manner analogous to that described in connection with the circuitry of FIGS. 4 and 5.

Figure 7:
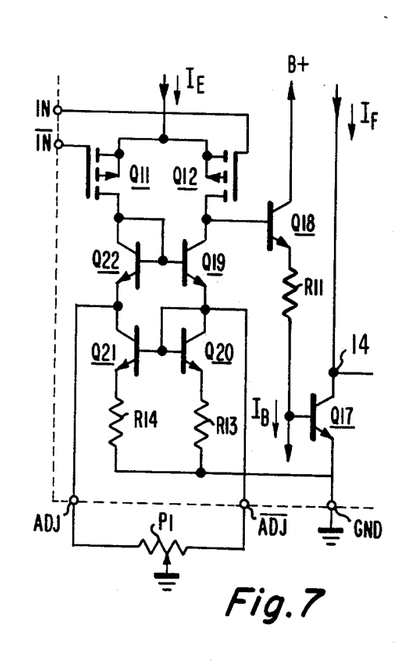

FIG. 7 shows circuitry obtained after modification of the FIG. 6 circuitry in way similar to that used to obtain the FIG. 5 circuitry by modification of the FIG. 4 circuitry. More specifically, Q21 receives a base potential equal to the offset potential across diode-connected transistor Q20 plus the potential drop across R13, and is provided with an emitter degeneration resistor R14. If the resistance $R_{14}$ of R14 is related to the resistance $R_{13}$ of R13 in a ratio that is the inverse of the ratio of the collector current versus emitter-to-base voltage characteristic of Q21 to that of Q20, the current, through Q20 and Q21 are the same as in the FIG. 6 circuitry. In the FIG. 7 circuitry the scaling of these currents is less dependent upon the matching of the operating characteristics of Q21 and Q22 than in the FIG. 6 circuitry.

Figure 8:
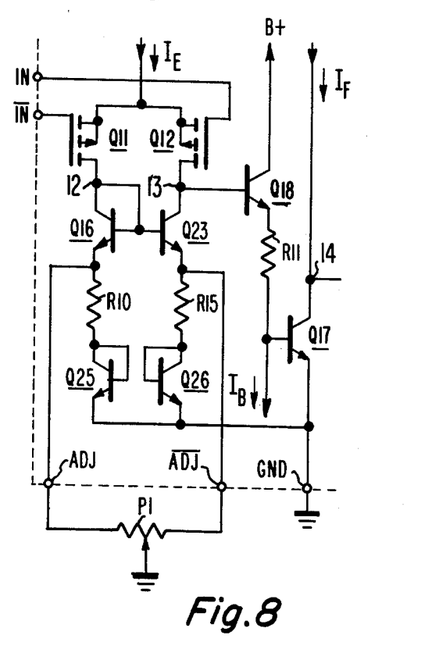

In the FIG. 8 circuitry balanced-to-single-ended signal conversion in the input amplifier stage is achieved using a current mirror amplifier configuration in which NPN transistors Q16 and Q23 may be considered to function as the master and slave mirroring transistors, respectively. Common-emitter-amplifier transistor Q23 is provided emitter degeneration by the series connection of resistor R15 and diode-connected NPN transistor Q24; and, similarly to FIG. 4, the emitter of Q16 is connected to ground by the series connection of resistor R10 and diode-connected transistor Q13. The flow of $I_{DQ11}$ through this latter series connection establishes voltage of $V_{10}/m$ at the terminals ADJ and $\overline{ADJ}$ in a manner analogous to the way those voltages are established in the FIG. 4 circuitry, so connections with potentiometer P1 permit symmetrical trimming just as in the FIG. 4 circuitry. R15 and Q24 are scaled to R10 and Q13, respectively, in ratios to obtain the desired current gain in the current mirror amplifier, so it responds to $I_{DQ11}$ to provide a collector current $I_{CQ23}$ of similar quiescent value as $I_{DQ12}$.

Figure 9:
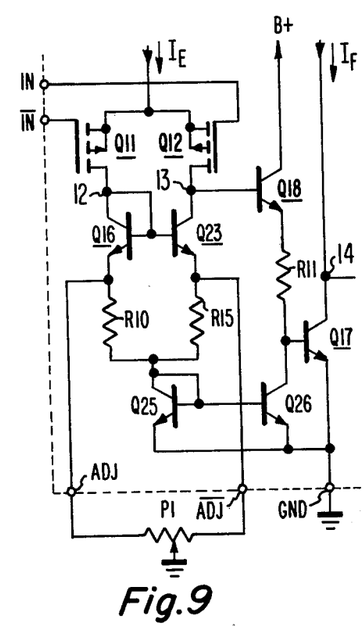

The FIG. 9 circuitry is a modification of that shown in FIG. 8. Since the collector potentials of grounded-emitter transistors Q13 and Q24 exhibit respective minor voltage variations around equal quiescent voltages, resistance-less direct connection between these collector electrodes little affects the operation of the CMA with Q16 and Q23 as master and slave mirroring transistors. The parallelled diode-connected transistors Q13 and Q24 can then be replaced, as shown in FIG. 9, by a single diode-connected NPN transistor Q25 with an emitter-base-junction area equal to the combined emitter-base-junction areas of Q13 and Q24. The emitter-to-base offset potential $V_{BEQ25}$ of Q25, if applied as the emitter-to-base potential $V_{BEQ26}$ of another NPN transistor Q26, will condition that transistor to demand a collector current $I_{CQ26}$ which is proportional to $I_E$ and thus to $I_A$. This current is suitable for application (in place of $I_B$) to the end of R11 remote from the emitter of Q18, so as to develop a potential drop across R11 that compensates for the potential drop across R10 and R15 in the direct coupling of node 13 to the base of grounded-emitter transistor Q17.

Figure 10:
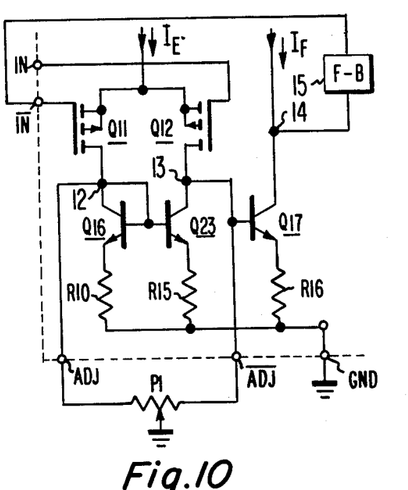

FIG. 10 shows another variant of the FIG. 8 circuitry which eliminates the $V_{BE}$ offsets between ground and the ends of R10 and R15 remote from the emitters of Q16 and Q23. More freedom for voltage swing at node 13 is an advantage of making this change. R16 is chosen of a value to maintain equal quiescent potentials at nodes 12 and 13 when a feedback connection is made between node 14 and the inverting input terminal $\overline{\text{IN}}$.

Figures 11, 13:
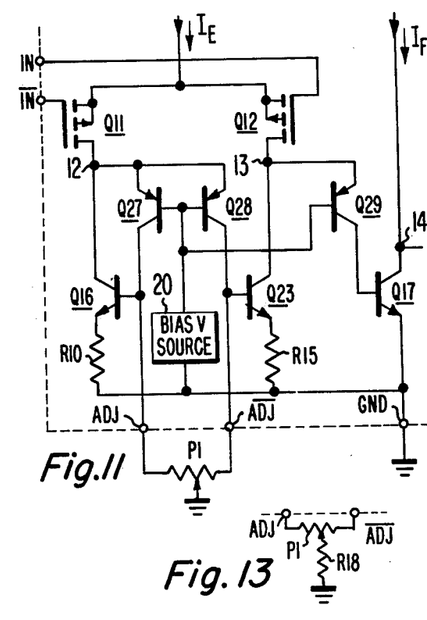
FIGS. 13, 14 and 15 each show a respective modification that can be made to any of the configurations shown in FIGS. 4, 5, 6, 7, 8, 9, 10, 11 and 12.

FIG. 11 shows a modification of the FIG. 10 circuitry in which PNP transistors Q27 and Q28 are connected as a current divider to apportion base currents to the base electrodes of Q16 and Q23. The emitter electrodes of Q27 and Q28 receive current from node 12; and the collector-to-base feedback connection for Q16, completed by the connection of the collector of Q27 to the base of Q16, adjusts the combined emitter currents of Q27 and Q28 so their collectors supply the base currents Q16 and Q23 require for current mirror amplifier operation. Q27 and Q28 operate in common-base configuration with their bases biased to a suitably positive potential by bias voltage source 20, which also biases a PNP common-base amplifier transistor Q29 used to connect node 13 to the base of transistor Q17. Bias voltage source 20 may simply consist of the interconnection of the base electrodes of Q27, Q28 and Q29 being directly connected to one of their collector electrodes. P1 connects at its end connections to the base electrodes of Q16 and Q23, connects at its tap connection to ground, and should have a higher resistance by about two orders of magnitude than in the FIG. 10 circuit.

Figure 12:
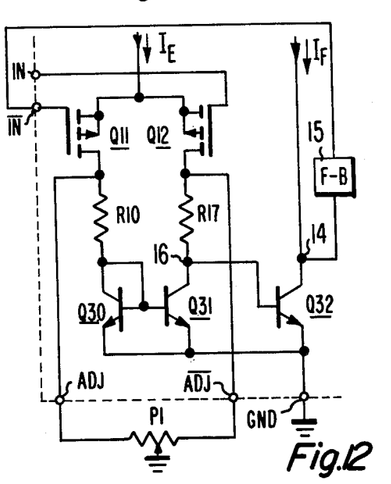

FIG. 12 shows how a conventional balanced-to-single-ended signal converter arrangement of NPN transistors Q30 and Q31 is modified by inclusion of resistors R10 and R17 to embody the present invention. Q30 and Q31 are the master and slave mirroring transistors, respectively, of a current mirror amplifier configuration. A quiescent current proportional to $I_A$ flows to the input of the current mirror amplifier through resistor R10. The resistance $R_{10}$ of R10 is chosen so that a quiescent potential essential to equal to $V_{10}/m$ appears across the series connection of R10 and diode-connected transistor 30—and thus between the GND and ADJ terminals. Responsive to its input current proportional to $I_A$, the current mirror amplifier demands an output current proportional to $I_A$, which demand under quiescent operating conditions is satisfied by the flow of $I_{CQ12}$ through resistor R17 connecting the drain of Q12 via node 16 to the collector of Q31. Node 16 is held at an emitter-to-base offset potential $V_{BEQ32}$'s remove from ground potential by the common-emitter amplifier action of Q32; this action is abetted by an amplifier that contains this input stage (and the grounded emitter amplifier stage with Q30) being provided with overall degenerative feedback, as is so often the case in operational amplifier circuitry. (In preferred embodiments the current $I_F$ will equal $I_E$, reducing the effects of base currents of Q30 and Q31 upon the CMA configuration comprising them.) The potential drop across an R17 of suitably chosen resistance $R_{17}$, arising from the flow of current proportional to $I_A$ through it, will add to $V_{BEQ32}$ to cause a quiescent potential essentially equal to $V_{10}/m$ to appear between the GND terminal and the $\overline{\text{ADJ}}$ terminal. This $\overline{\text{ADJ}}$ terminal is at the end of R17 to which the drain of Q12 connects.

Figure 14:
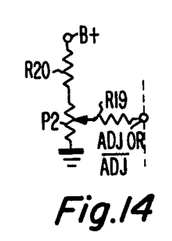
Figure 15:
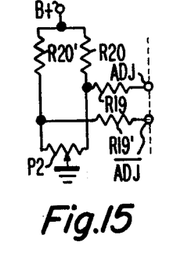

FIGS. 13, 14 and 15 show alternative arrangements of elements external to the integrated circuitry for trimming currents within the integrated circuit. FIG. 13 shows the adjustable-tap terminal of P1 connected to ground via a zero-temperature-coefficient "stop" resistor R18. FIG. 14 shows how a zero-temperature-coefficient resistor R19 can be connected from one of the terminals ADJ and $\overline{\text{ADJ}}$ to a relatively low resistance potential divider circuit, avoiding the need for two adjustment terminals in pin-limited integrated circuitry. This potential divider includes a potentiometer P2 having an adjustable-tap terminal to which R19 connects and end terminals connected to voltages straddling $V_{10}/m$. Resistor R20 is inserted to obtain symmetry of trim where one of these voltages departs more from $V_{10}/m$ than the other. P2 need not have a zero-temperature-coefficient resistance, and R20, if used, should have a resistance with a temperature coefficient that tracks that of P2. FIG. 15 shows a balanced arrangement similar to that shown in FIG. 14, R19' like R19 being a zero-temperature-coefficient "stop" resistor, and R20' like R20 having resistance with a temperature coefficient like that of P2.

By suitably adjusting resistance values the embodiments of the invention shown in FIGS. 4, 5, 6, 7, 8, 9, 10, 11 and 12 can be modified to accommodate $I_E$'s with positive-temperature-coefficients, or with negative-temperature-coefficients smaller than that of the offset potential across a forward-biased semiconductor junction. There are embodiments of the invention similar to FIG. 5, but in which a portion of the resistance of R10 is related to the position of R10 in FIG. 4 and in which R12 is reduced in resistance to maintain current mirror action between Q13 and Q14. Similarly there are embodiments of the invention similar to FIG. 7, but in which a portion of the resistance of R13 is relocated to the position of R13 in FIG. 6 and in which R14 is reduced in resistance to maintain current mirror action between Q20 and Q21. One skilled in the art of electronic design and armed with the foregoing disclosure can readily generate still other embodiments of the present invention; and the broader of the following claims should be liberally construed to include such embodiments of the invention within their scope.

What is claimed is:

1. In combination:

current source having a first and second terminals between which a current of predetermined temperature coefficient respective to a temperature T is generated;

adjustable zero-temperature-coefficient resistance means between said first and second terminals for conducting an adjustable, small portion of said current as a trim current;

a path between said first and second terminals for conducting the trimmed remainder of said current, said path being through a series connection essentially consisting of at least one semiconductor diode means poled for forward conduction and maintained at a temperature close to T, and positive-temperature-coefficient first resistance being maintained at a temperature close to T and being of such value that the potential across said series connection exhibits the same temperature coefficient as the current generated by said current source, causing said trim current to be a substantially temperature-independent fraction of the current generated by said current source.

2. A combination as set forth in claim 1 wherein said current source is of a type generating a temperature-independent current.

3. A combination as set forth in claim 2 wherein said source of temperature-independent current comprises:

second resistance with the same positive-temperature-coefficient as said first resistance, operated at the same temperature as said first resistance;

means providing an offset potential proportionally related to that of said semiconductor diode means;

means providing a reference potential that is of known value larger than said offset potential;

means for applying the difference between said reference and offset potentials across said second resistance for causing a current flow therethrough in accordance with Ohm's Law; and means responsive to that current flow for providing said temperature-independent current in proportion thereto.

4. In combination with a source of current with temperature-independent quiescent value, a current mirror amplifier comprising:

input and common terminals connected to receive said current with temperature-independent quiescent value;

an output terminal;

a bipolar master mirroring transistor and a bipolar slave mirroring transistor of like type, each having respective emitter and base and collector electrodes, having a respective emitter-base circuit between its emitter and base electrodes, having a respective emitter-collector circuit between its emitter and collector electrodes;

direct coupled feedback means between the emitter-collector circuit of said master mirroring transistor and its emitter-base circuit for applying a potential across its emitter-base circuit that conditions its emitter-collector circuit to conduct substantially all of any current thereto applied which is of the polarity associated with normal transistor action;

means for applying a potential across the emitter-base circuit of said slave mirroring transistor like unto that appearing across the emitter-base circuit of said master mirroring transistor;

means connecting the emitter-collector circuit of said slave mirroring transistor between said common and output terminals;

means connecting the emitter-collector circuit of said master mirroring transistor between said common and output terminals in a poling such that said current with temperature-independent quiescent value is conducted by normal transistor action, which means includes positive-temperature-coefficient resistance being in first series connection with the emitter-base circuit of said master mirroring transistor, and being of such value that a voltage with temperature-independent quiescent value appears across said first series connection.

5. A combination as set forth in claim 4 including:

adjustable, zero-temperature-coefficient, relatively-high-resistance means connected across said first series connection.

6. A combination as set forth in claim 4 including:

further positive-temperature-coefficient resistance being in second series connection with the emitter-base circuit of said slave mirroring transistor, and being of such value that a voltage with temperature-independent quiescent value appears across said second series connection.

7. A combination as set forth in claim 6 including:

an adjustable, zero-temperature-coefficient, relatively-high-resistance means connected across said second series connection.

8. A combination as set forth in claim 7 including:

a further adjustable, zero-temperature-coefficient, relatively-high-resistance means connected across said first series connection.

9. An amplifier stage comprising:

first and second supply terminals for receiving respective operating supply voltages means for supplying first and second input potentials in a range between said respective operating supply voltages;

first and second transistors of a first conductivity type and a third transistor of a second conductivity type complementary to said first conductivity type, each transistor having a respective input electrode and each having a respective principal current conduction path with ends defined by respective output and common electrodes of that transistor, the conduction of the principal current conduction path of each transistor being controlled by a respective one of said first and second input potentials being applied between its input and common electrodes;

constant current generator means for causing a current of predetermined temperature coefficient respective to a temperature T to flow from said first supply terminal for apportionment between the common electrodes of said first and second transistors in a ratio responsive to the relative values of their respective input potentials;

a first point of interconnection, to which the output electrode of said first transistor connects, direct coupled to the input electrode of said third transistor;

a second point of interconnection between the output electrodes of said second and third transistors, for supplying output signal;

fourth and fifth, bipolar transistors of said second conductivity type, each having respective base and emitter and collector electrodes and being operated at temperatures close to T;

means for connecting said fourth and fifth transistors as master and slave mirroring transistors of a component current mirror amplifier including first conductive means having a first end at said second supply terminal and having a second end at the emitter electrode of said fourth transistor, including second conductive means having a first end and having a second end to which the collector electrode of said fourth transistor connects, including third conductive means having a first end at said second supply terminal and having a second end at the emitter electrode of said fifth transistor, including fourth conductive means having a first end which connects to the common electrode of said third transistor and having a second end to which the collector electrode of said fifth transistor connects, and including direct coupling means direct coupling in like manner the second end of said second conductive means to each of the base electrodes of said fourth and fifth transistors;

positive-temperature-coefficient resistance maintained at a temperature close to T, included in at least one of said first and second conductive means, of sufficient value for causing voltage with said predetermined temperature coefficient to appear between said second supply terminal and the first end of said second conductive means; and means galvanically connecting the first end of said second conductive means to said first point of interconnection.

10. An amplifier stage as set forth in claim 9 wherein said first and third conductive means consist of direct connections without substantial impedances.

11. An amplifier stage as set forth in claim 9 wherein said second conductive means consists of a direct connection without substantial impedance.

12. An amplifier stage as set forth in claim 9, 10, or 11 combined with:

adjustable, zero-temperature-coefficient, relatively-high-resistance means connecting one of said first and second supply terminals to the first end of said second conductive means.

13. An amplifier stage as set forth in claim 9, 10, or 11 wherein said means galvanically connecting the first end of said second conductive means to said first point of interconnection includes:

a sixth transistor of the same type as said third transistor having an input electrode to which the first point of interconnection is direct coupled so as to make the potential at its input electrode equal that at the input electrode of said third transistor, having an output electrode connected to said first point of interconnection, and having a common electrode connected at the first end of said second conductive means; and adjustable, zero-temperature-coefficient, relatively-high-resistance means connecting one of said first and second supply terminals and the common electrode of said third transistor.

14. An amplifier stage as set forth in claim 13 including further adjustable, zero-temperature-coefficient, relatively-high-resistance means connecting one of said first and second supply terminals and the first end of said second conductive means.

15. An amplifier stage comprising:

first and second supply terminals for receiving respective operating supply voltages means for supplying first and second input potentials in a range between said respective operating supply voltages;

first and second transistors of a first conductivity type and a third transistor of a second conductivity type complementary to said first conductivity type, each transistor having a respective input electrode and each having a respective principal current conduction path with ends defined by respective output and common electrodes of that transistor, the conduction of the principal current conduction path of each transistor being controlled by a respective one of said first and second input potentials being applied between its input and common electrodes;

constant current generator means for causing a current of predetermined temperature coefficient respective to a temperature T to flow from said first supply terminal for apportionment between the common electrodes of said first and second transistors in a ratio responsive to the relative values of their respective input potentials;

a first point of interconnection, to which the output electrode of said first transistor connects, direct coupled to the input electrode of said third transistor;

a second point of interconnection between the output electrodes of said second and third transistors, for supplying output signal;

fourth and fifth, bipolar transistors of said second conductivity type, each having respective base and emitter and collector electrodes and being operated at temperatures close to T;

means for connecting said fourth and fifth transistors as master and slave mirroring transistors of a component current mirror amplifier including first conductive means having a first end at said second supply terminal and having a second end at the emitter electrode of said fourth transistor, including second conductive means having a first end which connects to the common terminal of said third transistor and having a second end to which the collector electrode of said fourth transistor connects, including third conductive means having a first end at said second supply terminal and having a second end at the emitter electrode of said fifth transistor, including fourth conductive means having a first end and having a second end to which the collector electrode of said fifth transistor connects, and including direct coupling means direct coupling in like manner the second end of said second conductive means to each of the base electrodes of said fourth and fifth transistors;

positive-temperature-coefficient resistance maintained at a temperature close to T, included in at least one of said first and second conductive means, of sufficient value for causing a voltage with said predetermined temperature coefficient to appear between said second supply terminal and the first end of said second conductive means; and means galvanically connecting the first end of said fourth conductive means to said first point of interconnection.

16. An amplifier stage as set forth in claim 15 wherein said first and third conductive means consist of direct connections without substantial impedances.

17. An amplifier stage as set forth in claim 15 wherein said second conductive means consists of a direct connection without substantial impedance.

18. An amplifier stage as set forth in claim 15, 16, or 17 combined with:

adjustable, zero-temperature-coefficient, relatively-high-resistance means connecting one of said first and second supply terminals to the first end of said second conductive means.

19. An amplifier stage as set forth in claim 15, 16, or 17 wherein the first end of said second conductive means is directly connected without substantial intervening impedance to the common electrode of said third transistor and wherein said means galvanically connecting the first end of said fourth conductive means to said first point of interconnection includes:

a sixth transistor of the same type as said third transistor having an input electrode to which the first point of interconnection is direct coupled so as to make the potential at its input electrode equal that at the input electrode of said third transistor, having an output electrode connected to said first point of interconnection, and having a common electrode connected at the first end of said fourth conductive means; and adjustable, zero-temperature-coefficient, relatively-high-resistance means connecting one of said first and second supply terminals and the common electrode of said third transistor.

20. An amplifier stage as set forth in claim 19 including further adjustable, zero-temperature-coefficient, relatively-high-resistance means connecting one of said first and second supply terminals and the common electrode of said sixth transistor.

21. An amplifier stage comprising:

first and second supply terminals for receiving respective operating supply voltages means for supplying first and second input potentials in a range between said respective operating supply voltages;

first and second transistors of a first conductivity type and a third transistor of a second conductivity type complementary to said first conductivity type, each transistor having a respective input electrode and each having a respective principal current conduction path with ends defined by respective output and common electrodes of that transistor, the conduction of the principal current conduction path of each transistor being controlled by a respective one of said first and second input potentials being applied between its input and common electrodes;

constant current generator means for causing a current of predetermined temperature coefficient respective to a temperature T to flow from said first supply terminal for apportionment between the common electrodes of said first and second transistors in a ratio responsive to the relative values of their respective input potentials;

a first point of interconnection, to which the output electrode of said first transistor connects, direct coupled to the input electrode of said third transistor;

a second point of interconnection between the output electrodes of said second and third transistors, for supplying output signal;

a fourth, bipolar transistor of said second conductivity type, having base and emitter and collector electrodes and being operated at a temperature close to T;

semiconductor junction diode means operated at a temperature close to T;

means for connecting said fourth transistor and said semiconductor junction diode means in a component current mirror amplifier including first conductive means having a first end at said second supply terminal and having a second end at the emitter electrode of said fourth transistor, including second conductive means having a first end and having a second end to which the collector electrode of said fourth transistor connects, including third conductive means in series connection with forward-poled said semiconductor junction diode means between said second supply terminal and the base electrode of said fourth transistor, and including fourth conductive means having a first end which connects to the common electrode of said third transistor and having a second end connected to the base electrode of said fourth transistor;

positive-temperature-coefficient resistance maintained at a temperature close to T, included in at least one of said third and fourth conductive means, of sufficient value for causing a voltage with said predetermined temperature coefficient to appear between said second supply terminal and the first end of said fourth conductive means; and means galvanically connecting the first end of said second conductive means to said first point of interconnection.

22. An amplifier stage as set forth in claim 21 wherein said first and third conductive means consist of direct connections without substantial impedances.

23. An amplifier stage as set forth in claim 21 wherein said fourth conductive means consists of a direct connection without substantial impedance.

24. An amplifier stage as set forth in claim 21, 22, or 23 combined with:

adjustable, zero-temperature-coefficient, relatively-high-resistance means connecting one of said first and second supply terminals to the first end of said fourth conductive means.

25. An amplifier stage as set forth in claim 21, 22, or 23, wherein the first end of said fourth conductive means is directly connected without substantial intervening impedance to the common electrode of said third transistor, and wherein said means galvanically connecting the first end of said second conductive means to said first point of interconnection includes:

a sixth transistor of the same type as said third transistor having an input electrode to which the first point of interconnection is direct coupled so as to make the potential at its input electrode equal to that at the input electrode of said third transistor, having an output electrode connected to said first point of interconnection, and having a common electrode connected at the first end of said second conductive means; and adjustable, zero-temperature-coefficient, relatively-high-resistance means connecting one of said first and second supply terminals and the common electrode of said sixth transistor.

26. An amplifier stage as set forth in claim 25 including further adjustable, zero-temperature-coefficient, relatively-high-resistance means connecting one of said first and second supply terminals and the first end of said second conductive means.

27. An amplifier stage comprising:

first and second supply terminals for receiving respective operating supply voltages means for supplying first and second input potentials in a range between said respective operating supply voltages;

first and second transistors of a first conductivity type and a third transistor of a second conductivity type complementary to said first conductivity type, each transistor having a respective input electrode and each having a respective principal current conduction path with ends defined by respective output and common electrodes of that transistor, the conduction of the principal current conduction path of each transistor being controlled by a respective one of said first and second input potentials being applied between its input and common electrodes;

constant current generator means for causing a current of predetermined temperature coefficient respective to a temperature T to flow from said first supply terminal for apportionment between the common electrodes of said first and second transistors in a ratio responsive to the relative values of their respective input potentials;

a first point of interconnection, to which the output electrode of said first transistor connects, direct coupled to the input electrode of said third transistor;

a second point of interconnection between the output electrodes of said second and third transistors, for supplying output signal;

a fourth, bipolar transistor of said second conductivity type, having base and emitter and collector electrodes and being operated at a temperature close to T;

semiconductor junction diode means being operated at a temperature close to T;

means for connecting said fourth transistor and said semiconductor junction diode means in a component current mirror amplifier including first conductive means having a first end at said second supply terminal and having a second end at the emitter electrode of said fourth transistor, including second conductive means having a first end which connects to the common electrode of said third transistor and having a second end to which the collector electrode of said fourth transistor connects, including third conductive means in series connection with forward-poled said semiconductor junction diode means between said second supply terminal and the base electrode of said fourth transistor, and including fourth conductive means having a first end and having a second end connected to the base electrode of said fourth transistor;

positive-temperature-coefficient resistance maintained at a temperature close to T, included in at least one of said third and fourth conductive means, of sufficient value for causing a voltage with said predetermined temperature coefficient to appear between said second supply terminal and the first end of said second conductive means; and means galvanically connecting the first end of said fourth conductive means to said first point of interconnection.

28. An amplifier stage as set forth in claim 27 wherein said first and third conductive means consist of direct connections without substantial impedances.

29. An amplifier stage as set forth in claim 27 wherein said fourth conductive means consists of a direct connection without substantial impedance.

30. An amplifier stage as set forth in claim 27, 28, or 29 combined with:

adjustable, zero-temperature-coefficient, relatively-high-resistance means connecting one of said first and second supply terminals to the first end of said fourth conductive means.

31. An amplifier stage as set forth in claim 27, 28, or 29 wherein said means galvanically connecting the first end of said fourth conductive means to said first point of interconnection includes:

a sixth transistor of the same type as said third transistor having an input electrode to which the first point of interconnection is direct coupled so as to make the potential at its input electrode equal to that of the input electrode of said third transistor, having an output electrode connected to said first point of interconnection, and having a common electrode connected at the first end of said fourth conductive means; and adjustable, zero-temperature-coefficient, relatively-high-resistance means connecting one of said first and second supply terminals and the common electrode of said third transistor.

32. An amplifier stage as set forth in claim 31 including further adjustable, zero-temperature-coefficient, relatively-high-resistance means connecting one of said first and second supply terminals and the common electrode of said sixth transistor.

33. An amplifier stage comprising:

first and second supply terminals for receiving respective operating supply voltages means for supplying first and second input potentials in a range between said respective operating supply voltages;

first and second transistors of a first conductivity type and third and fourth transistors of a second conductivity type complementary to said first conductivity type, each transistor having a respective input electrode and each having a respective principal current conduction path with ends defined by respective output and common electrodes of that transistor, the conduction of the principal current conduction path of each transistor being controlled by a respective one of said first and second input potentials being applied because its input and common electrodes;

constant current generator means for causing a current of predetermined temperature coefficient respective to a temperature T to flow from said first supply terminal for apportionment between the common electrodes of said first and second transistors in a ratio responsive to the relative values of their respective input potentials;

a first point of interconnection between the output electrodes of said first and third transistors;

means direct coupling the first point of interconnection in like manner to each of the input electrodes of said third and fourth transistors;

a second point of interconnection between the output electrodes of said second and fourth transistors, for supplying output signal, first and second semiconductor junction diode means operated at temperatures close to T;

a first resistive element being serially connected with forward-poled said first semiconductor junction diode means between the common electrode of said third transistor and said second supply terminal, and having a positive-temperature-coefficient resistance respective to T of sufficient value for causing a quiescent voltage with said predetermined temperature coefficient to appear between said second supply terminal and the common electrode of said third transistor; and a second resistive element being serially connected with forward-poled said second semiconductor junction diode means between the common electrode of said fourth transistor and said second supply terminal, and having a positive-temperature-coefficient resistance respective to T of sufficient value for causing quiescent voltage of said predetermined temperature coefficient to appear between said second supply terminal and the common electrode of said fourth transistor.

34. An amplifier stage comprising:
first and second supply terminals for receiving respective operating supply voltages
means for supplying first and second input potentials in a range between said respective operating supply voltages;
first and second transistors of a first conductivity type and third and fourth transistors of a second conductivity type complementary to said first conductivity type, each transistor having a respective input electrode and each having a respective principal current conduction path with ends defined by respective output and common electrodes of that transistor, the conduction of the principal current conduction path of each transistor being controlled by a respective one of said first and second input potentials being applied between its input and common electrodes;
constant current generator means for causing a current of predetermined temperature coefficient respective to a temperature T to flow from said first supply terminal for apportionment between the common electrodes of said first and second transistors in a ratio responsive to the relative values of their respective input potentials;
a first point of interconnection between the output electrodes of said first and third transistors;
means direct coupling the first point of interconnection in like manner to each of the input electrodes of said third and fourth transistors;
a second point of interconnection between the output electrodes of said second and fourth transistors, for supplying output signal,
first and second conductive means respectively connecting a third point of interconnection to the common electrode of said third transistor and to the common electrode of said fourth transistor;
forward-poled semiconductor junction diode means being operated at a temperature close to T connecting said third point of interconnection and said second supply terminal;
first and second resistive elements corresponding to said first and second conductive means, respectively, and having respective positive-temperature-coefficient resistances respective to T of sufficient values for causing voltages of said predetermined temperature coefficient to appear between said second supply terminal and each of the common electrodes of said third and fourth transistors.

35. An amplifier stage as set forth in claim 33 or 34 including:
adjustable, zero-temperature-coefficient, relatively-high-resistance means connecting one of said first and second supply terminals and the common electrode of said third transistor.

36. An amplifier stage as set forth in claim 33 or 34 including:
adjustable, zero-temperature-coefficient, relatively-high-resistance means connecting one of said first and second supply terminals and the common electrode of said fourth transistor.

37. An amplifier stage comprising:
first and second supply terminals for receiving respective operating supply voltages
means for supplying first and second input potentials in a range between said respective operating supply voltages;
first and second transistors of a first conductivity type, each transistor having a respective input electrode and each having a respective principal current conduction path with ends defined by respective output and common electrodes of that transistor, the conduction of the principal current conduction path of each transistor being controlled by a respective one of said first and second input potentials being applied between its input and common electrodes;
constant current generator means for causing a current of predetermined temperature coefficient respective to a temperature T to flow from said first supply terminal for apportionment between the common electrodes of said first and second transistors in a ratio responsive to the relative values of their respective input potentials;
third and fourth bipolar transistors of a second conductivity type complementary to said first conductivity type, each of these transistors having respective base and emitter and collector electrodes and being operated at a temperature close to T;
a first point of interconnection between the output electrode of said first transistor and the collector electrode of said third transistor,
means direct coupling said first point of interconnection to the base electrodes of said third and fourth transistors;
a second point of interconnection between the output electrode of said second transistor and the collector electrode of said fourth transistor, for supplying output signal;
first and second resistive elements respectively connecting said second supply terminal to the emitter electrode of said third transistor and to the emitter electrode of said fourth transistor and exhibiting respective positive-temperature-coefficient resistances respective to T of sufficient values to cause the voltage between said second terminal and each of the base electrodes of said third and fourth transistors to exhibit said predetermined temperature coefficient.

38. An amplifier stage as set forth in claim 37 including:
adjustable, zero-temperature-coefficient, relatively-high-resistance means connecting one of said first and second supply terminals to the base electrode of said third transistor.

39. An amplifier stage as set forth in claim 37 or 38 wherein said means direct coupling said first point of interconnection to the base electrodes of said third and fourth transistors consists of direct connections without substantial intervening impedances of said first point of interconnection to the base electrodes of said third and fourth transistors; wherein means are provided for maintaining equal quiescent potential at said second point of interconnection as at said first point of interconnection; and wherein further, adjustable, zero-temperature-coefficient, relatively-high-resistance means connects one of said first and second supply terminals to said second point of interconnection.

40. An amplifier stage as set forth in claim 37 or 38 wherein said means direct coupling said first point of interconnection to the electrodes of said third and fourth transistors comprises;

a current divider having an input at said first point of interconnection and first and second outputs at the base electrodes of said third and fourth transistors, respectively.

41. An amplifier stage as set forth in claim 40 wherein further, adjustable, zero-temperature-coefficient, relatively-high-resistance means connecting one of said first and second supply terminals to the base electrode of said fourth transistor.

42. An amplifier stage comprising:

first and second supply terminals for receiving respective operating supply voltages means for supplying first and second input potentials in a range between said respective operating supply voltages;

first and second transistors of a first conductivity type, each transistor having a respective input electrode and each having a respective principal current conduction path with ends defined by respective output and common electrodes of that transistor, the conduction of the principal current conduction path of each transistor being controlled by a respective one of said first and second input potentials being applied between its input and common electrodes;

constant current generator means for causing a current of predetermined temperature coefficient to flow from said first supply terminal for apportionment between the common electrodes of said first and second transistors in a ratio responsive to the relative values of their respective input potentials;

third and fourth, bipolar transistors of a second conductivity type complementary to said first conductivity type, each of which transistors has respective base and emitter and collector electrodes and is operated at a temperature close to T;

first conductive means having a first end to which the output electrode of said first transistor connects and having a second end to which the collector electrode of said third transistor connects;

second conductive means having a first end to which the output electrode of said first transistor connects, having a second end to which the collector electrode of said fourth transistor connects, and having a point there along at which an output signal is supplied;

means for connecting said third and fourth transistors as master and slave mirroring transistors of a component current mirror amplifier, including direct coupling means direct coupling in like manner the second end of said first conductive means to each of the base electrodes of said third and fourth transistors, including third conductive means having a first end connected at said second supply terminal and having a second end connected at the emitter electrode of said third transistor, and including fourth conductive means having a first end connected at said second supply terminal and having a second end connected at the emitter electrode of said fourth transistor; and positive-temperature-coefficient resistance included in at least one of said first and third conductive means of sufficient value for causing a voltage with said predetermined temperature coefficient to appear between said second supply terminal and the first end of said first conductive means.

43. An amplifier stage as set forth in claim 42 including adjustable, zero-temperature-coefficient, relatively-high-resistance means connecting one of said first and second supply terminals and the first end of said first conductive means.

44. An amplifier stage as set forth in claim 42 or 43 wherein said third and fourth conductive means are substantially zero impedance connections; wherein a fifth, bipolar transistor has a base electrode at the second end of said second conductive means, has an emitter electrode at said second supply terminal, has a collector electrode connected to said first supply terminal and direct coupled to the input electrode of the one of said first and second transistors as completes a degenerative feedback connection and is operated at a temperature close to T; wherein said second conductive means includes further positive-temperature-coefficient resistance of sufficient value for causing a voltage with said predetermined temperature coefficient to appear between said second supply terminal and the first end of said second conductive means; and wherein further, adjustable, zero-temperature-coefficient, relatively-high-resistance means connects one of said first and second supply terminals and the first end of said second conductive means.

* * * * *

UNITED STATES PATENT AND TRADEMARK OFFICE
CERTIFICATE OF CORRECTION

PATENT NO. : 4,243,948
DATED : January 6, 1981
INVENTOR(S) : Otto H. Schade, Jr.

It is certified that error appears in the above—identified patent and that said Letters Patent is hereby corrected as shown below:

Column 1, Line 9  —  before "amplifiers" insert -- mirror -- ;

Column 5, Line 17  —  change "$I_1$" to -- $I_A$ -- ; and

Column 18, Line 34  —  change "because" to -- between -- .

Signed and Sealed this

Twenty-fifth Day of August 1981

[SEAL]

Attest:

Attesting Officer

GERALD J. MOSSINGHOFF
Commissioner of Patents and Trademarks